US008482919B2

(12) United States Patent
Dede

(10) Patent No.: US 8,482,919 B2
(45) Date of Patent: Jul. 9, 2013

(54) POWER ELECTRONICS CARD ASSEMBLIES, POWER ELECTRONICS MODULES, AND POWER ELECTRONICS DEVICES

(75) Inventor: Ercan Mehmet Dede, Ann Arbor, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 294 days.

(21) Appl. No.: 13/083,808

(22) Filed: Apr. 11, 2011

(65) Prior Publication Data

US 2012/0257354 A1 Oct. 11, 2012

(51) Int. Cl.
*H05K 7/20* (2006.01)
*F28F 7/00* (2006.01)

(52) U.S. Cl.
USPC .......................... 361/699; 165/80.4; 165/908

(58) Field of Classification Search
USPC .......................... 165/908; 361/699
See application file for complete search history.

(56) References Cited

U.S. PATENT DOCUMENTS

| | | | |
|---|---|---|---|
| 4,322,737 A | 3/1982 | Sliwa, Jr. | |
| 4,392,153 A | 7/1983 | Glascock, II et al. | |
| 4,494,171 A | 1/1985 | Bland et al. | |
| 4,733,293 A | 3/1988 | Gabuzda | |
| 4,748,495 A | 5/1988 | Kucharek | |
| 4,783,721 A | 11/1988 | Yamamoto et al. | |
| 4,868,712 A | 9/1989 | Woodman | |
| 4,920,574 A | 4/1990 | Yamamoto et al. | |
| 5,016,138 A | 5/1991 | Woodman | |
| 5,023,695 A | 6/1991 | Umezawa et al. | |
| 5,079,619 A | 1/1992 | Davidson | |
| 5,088,005 A | 2/1992 | Ciaccio | |
| 5,119,175 A | 6/1992 | Long et al. | |
| 5,145,001 A | 9/1992 | Valenzuela | |
| 5,210,440 A | 5/1993 | Long | |
| 5,228,502 A | 7/1993 | Chu et al. | |
| 5,260,850 A | 11/1993 | Sherwood et al. | |
| 5,269,372 A | 12/1993 | Chu et al. | |
| 5,270,572 A | 12/1993 | Nakajima et al. | |
| 5,394,299 A | 2/1995 | Chu et al. | |
| 5,546,274 A | 8/1996 | Davidson | |

(Continued)

OTHER PUBLICATIONS

U.S. Appl. No. 12/880,422, filed Sep. 13, 2010, titled: Cooling Apparatuses and Power Electronics Modules.

(Continued)

*Primary Examiner* — Gregory Thompson
(74) *Attorney, Agent, or Firm* — Dinsmore & Shohl LLP

(57) ABSTRACT

A power electronics card assembly includes a printed circuit board assembly including a printed circuit board substrate, a power electronics device opening, a fluid inlet channel extending from a perimeter of the printed circuit board assembly to the power electronics device opening, a fluid outlet channel within the printed circuit board substrate extending from the perimeter of the printed circuit board assembly to the power electronics device opening, and electrically conductive power connections. A power electronics device is positioned within the power electronics device opening and includes a fluid inlet layer fluidly coupled to the fluid inlet channel, a fluid outlet layer fluidly coupled to the fluid outlet channel, a target heat transfer layer fluidly coupled to the fluid inlet layer, a second pass-heat transfer layer and a power device layer. The second-pass heat transfer layer is fluidly coupled to the target heat transfer layer and the fluid outlet layer.

20 Claims, 7 Drawing Sheets

U.S. PATENT DOCUMENTS

| | | | |
|---|---|---|---|
| 5,912,800 A | 6/1999 | Sammakia et al. | |
| 5,983,997 A | 11/1999 | Hou | |
| 6,058,010 A | 5/2000 | Schmidt et al. | |
| 6,084,771 A * | 7/2000 | Ranchy et al. | 361/699 |
| 6,167,948 B1 | 1/2001 | Thomas | |
| 6,242,075 B1 | 6/2001 | Chao et al. | |
| 6,305,463 B1 | 10/2001 | Salmonson | |
| 6,333,853 B2 | 12/2001 | O'Leary et al. | |
| 6,431,260 B1 | 8/2002 | Agonafer et al. | |
| 6,501,654 B2 | 12/2002 | O'Connor et al. | |
| 6,580,609 B2 | 6/2003 | Pautsch | |
| 6,665,185 B1 | 12/2003 | Kulik et al. | |
| 6,828,675 B2 | 12/2004 | Memory et al. | |
| 6,903,931 B2 | 6/2005 | McCordic et al. | |
| 6,942,018 B2 | 9/2005 | Goodson et al. | |
| 6,952,346 B2 | 10/2005 | Tilton et al. | |
| 6,972,365 B2 | 12/2005 | Garner | |
| 6,986,382 B2 | 1/2006 | Upadhya et al. | |
| 6,988,535 B2 | 1/2006 | Upadhya et al. | |
| 6,992,382 B2 | 1/2006 | Chrysler et al. | |
| 6,994,151 B2 | 2/2006 | Zhou et al. | |
| 7,009,842 B2 * | 3/2006 | Tilton et al. | 361/699 |
| 7,017,654 B2 | 3/2006 | Kenny et al. | |
| 7,058,101 B2 | 6/2006 | Treusch et al. | |
| 7,071,408 B2 | 7/2006 | Garner | |
| 7,104,312 B2 | 9/2006 | Goodson et al. | |
| 7,119,284 B2 | 10/2006 | Bel et al. | |
| 7,184,269 B2 | 2/2007 | Campbell et al. | |
| 7,188,662 B2 | 3/2007 | Brewer et al. | |
| 7,204,303 B2 | 4/2007 | Thomas et al. | |
| 7,205,653 B2 | 4/2007 | Brandenburg et al. | |
| 7,212,409 B1 | 5/2007 | Belady et al. | |
| 7,250,674 B2 | 7/2007 | Inoue | |
| 7,295,440 B2 | 11/2007 | Ganev et al. | |
| 7,298,617 B2 | 11/2007 | Campbell et al. | |
| 7,298,618 B2 | 11/2007 | Campbell et al. | |
| 7,302,998 B2 | 12/2007 | Valenzuela | |
| 7,327,570 B2 | 2/2008 | Belady | |
| 7,336,493 B2 | 2/2008 | Berkenbush et al. | |
| 7,355,277 B2 | 4/2008 | Myers et al. | |
| 7,365,981 B2 | 4/2008 | Myers et al. | |
| 7,385,817 B2 | 6/2008 | Campbell et al. | |
| 7,393,226 B2 | 7/2008 | Clayton et al. | |
| 7,397,662 B2 | 7/2008 | Oyamada | |
| 7,400,504 B2 | 7/2008 | Campbell et al. | |
| 7,414,843 B2 * | 8/2008 | Joshi et al. | 361/699 |
| 7,414,844 B2 | 8/2008 | Wilson et al. | |
| 7,429,792 B2 | 9/2008 | Lee et al. | |
| 7,435,623 B2 | 10/2008 | Chrysler et al. | |
| 7,450,378 B2 | 11/2008 | Nelson et al. | |
| 7,486,514 B2 | 2/2009 | Campbell et al. | |
| 7,495,916 B2 | 2/2009 | Shiao et al. | |
| 7,551,439 B2 | 6/2009 | Peugh et al. | |
| 7,599,184 B2 | 10/2009 | Upadhya et al. | |
| 7,608,924 B2 | 10/2009 | Myers et al. | |
| 7,679,911 B2 | 3/2010 | Rapp | |
| 7,738,249 B2 | 6/2010 | Chan et al. | |
| 7,795,726 B2 | 9/2010 | Myers et al. | |
| 7,808,780 B2 | 10/2010 | Brunschwiler et al. | |
| 7,830,664 B2 | 11/2010 | Campbell et al. | |
| 7,835,151 B2 * | 11/2010 | Olesen | 361/689 |
| 7,836,694 B2 * | 11/2010 | Arnold | 60/605.3 |
| 7,839,642 B2 | 11/2010 | Martin et al. | |
| 8,199,505 B2 * | 6/2012 | Dede | 361/702 |
| 8,243,451 B2 * | 8/2012 | Dede et al. | 361/702 |
| 2002/0053726 A1 | 5/2002 | Mikubo et al. | |
| 2003/0196451 A1 | 10/2003 | Goldman et al. | |
| 2005/0121180 A1 | 6/2005 | Marsala | |
| 2005/0168947 A1 * | 8/2005 | Mok et al. | 361/698 |
| 2005/0199372 A1 | 9/2005 | Frazer et al. | |
| 2005/0225938 A1 | 10/2005 | Montgomery et al. | |
| 2006/0002086 A1 | 1/2006 | Teneketges et al. | |
| 2006/0291164 A1 | 12/2006 | Myers et al. | |
| 2007/0034360 A1 | 2/2007 | Hall | |
| 2007/0041160 A1 | 2/2007 | Kehret et al. | |
| 2007/0074856 A1 | 4/2007 | Bhatti et al. | |
| 2007/0114656 A1 | 5/2007 | Brandenburg et al. | |
| 2007/0119565 A1 | 5/2007 | Brunschwiler et al. | |
| 2007/0177352 A1 | 8/2007 | Monfarad et al. | |
| 2007/0188991 A1 | 8/2007 | Wilson et al. | |
| 2007/0230127 A1 | 10/2007 | Peugh et al. | |
| 2007/0236883 A1 | 10/2007 | Ruiz | |
| 2008/0093053 A1 | 4/2008 | Song et al. | |
| 2008/0245506 A1 | 10/2008 | Campbell et al. | |
| 2009/0032937 A1 | 2/2009 | Mann et al. | |
| 2009/0090490 A1 | 4/2009 | Yoshida et al. | |
| 2009/0108439 A1 | 4/2009 | Brandenburg et al. | |
| 2009/0294106 A1 | 12/2009 | Flotta et al. | |
| 2010/0000766 A1 | 1/2010 | Loiselet et al. | |
| 2010/0038774 A1 | 2/2010 | Zhang et al. | |
| 2010/0134996 A1 | 6/2010 | Loiselet | |
| 2010/0142150 A1 | 6/2010 | Campbell et al. | |
| 2010/0242178 A1 | 9/2010 | Goetting | |
| 2010/0246117 A1 | 9/2010 | Brunschwiler et al. | |

OTHER PUBLICATIONS

U.S. Appl. No. 12/984,905, filed Jan. 5, 2011, titled: Cold Plate Assemblies and Power Electronics Modules.

U.S. Appl. No. 13/029,216, filed Feb. 17, 2011, titled: Power Electronics Modules and Power Electronics Module Assemblies.

U.S. Appl. No. 12/880,386, filed Sep. 13, 2010, titled: Jet Impingement Heat Exchanger Apparatuses and Power Electronics Modules.

U.S. Appl. No. 12/839,039, filed Jul. 19, 2010, titled: Heat Exchanger Fluid Distribution Manifolds and Power Electronics Modules Incorporating the Same.

* cited by examiner

POWER ELECTRONICS CARD ASSEMBLIES, POWER ELECTRONICS MODULES, AND POWER ELECTRONICS DEVICES

CROSS REFERENCE TO RELATED APPLICATIONS

This application is related to U.S. patent application Ser. No. 12/839,039 entitled "Heat Exchanger Fluid Distribution Manifolds and Power Electronics Modules Incorporating the Same," filed on Jul. 19, 2010, which is hereby incorporated by reference in its entirety, but does not claim priority thereto. This application is also related to U.S. patent application Ser. No. 12/880,386 entitled "Jet Impingement Heat Exchanger Apparatuses and Power Electronics Modules," filed on Sep. 13, 2010, which is hereby incorporated by reference in its entirety, but does not claim priority thereto. This application is also related to U.S. patent application Ser. No. 12/984,905 entitled "Cold Plate Assemblies and Power Electronics Module," filed on Jan. 5, 2011, which is hereby incorporated by reference in its entirety, but does not claim priority thereto. This application is also related to U.S. patent application Ser. No. 13/029216 entitled "Power Electronics Modules and Power Electronics Module Assemblies," filed on Feb. 17, 2011, which is hereby incorporated by reference in its entirety, but does not claim priority thereto.

TECHNICAL FIELD

The present specification generally relates to power electronics device packaging and, more particularly, to power electronics card assemblies, power electronics modules, and power electronics devices having internal cooling structures.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging. Additionally, most power electronics systems are fixed in size for one application with a set number of power devices. Thus, once an assembly is configured, it cannot be increased or reduced in power capacity or physical size.

Accordingly, a need exists for alternative power electronics card assemblies, power electronics modules, and power electronics devices having internal cooling structures.

SUMMARY

In one embodiment, a power electronics card assembly includes a printed circuit board assembly and a power electronics device. The printed circuit board assembly includes a printed circuit board substrate, a power electronics device opening within the printed circuit board substrate, a fluid inlet channel extending within the printed circuit board substrate from a perimeter of the printed circuit board assembly to the power electronics device opening, a fluid outlet channel within the printed circuit board substrate extending from the perimeter of the printed circuit board assembly to the power electronics device opening, and electrically conductive power connections. The power electronics device is positioned within the power electronics device opening and includes a fluid inlet layer fluidly coupled to the fluid inlet channel, a fluid outlet layer fluidly coupled to the fluid outlet channel, a target heat transfer layer fluidly coupled to the fluid inlet layer, a second pass-heat transfer layer and a power device layer. The second-pass heat transfer layer is fluidly coupled to the target heat transfer layer and the fluid outlet layer such that coolant fluid flowing through the fluid inlet layer impinges the target heat transfer layer, flows into the second-pass heat transfer layer, and out of the fluid outlet channel. The power device layer is coupled to the target heat transfer layer. The fluid inlet layer, the fluid outlet layer, the target heat transfer layer, the second-pass heat transfer layer, and the power device layer comprise a semiconductor material.

In another embodiment, the power electronics device includes a fluid inlet layer, a target heat transfer layer, a power device layer, a second-pass heat transfer layer, a fluid outlet layer, and a jet impingement nozzle, all made of a semiconductor material. The fluid inlet layer includes a device fluid inlet channel and a fluid inlet hole such that the device fluid inlet channel is fluidly coupled to the fluid inlet hole and a perimeter of the fluid inlet layer. The target heat transfer layer includes a plurality of target heat transfer layer fins that define a plurality of target heat transfer layer microchannels extending in a radial direction from a central impingement region. The power device layer is coupled to the target heat transfer layer. The second-pass heat transfer layer is coupled to the target heat transfer layer and includes a second-pass outlet region, a plurality of second-pass heat transfer layer fins that define a plurality of second-pass heat transfer layer microchannels extending in a radial direction toward the second-pass outlet region, and one or more transition channels positioned at a perimeter of the second-pass heat transfer layer. The one or more transition channels fluidly couple the target heat transfer layer to the second-pass heat transfer layer. The fluid outlet layer is coupled to the fluid inlet layer and the second-pass heat transfer layer and includes a device fluid outlet channel and a fluid outlet hole. The device fluid outlet channel is fluidly coupled to the fluid outlet hole and a perimeter of the fluid outlet layer, and the fluid outlet hole is fluidly coupled to the second-pass outlet region. A diameter of the fluid outlet hole is greater than a diameter of the fluid inlet hole. The jet impingement nozzle is positioned through the fluid outlet hole and is fluidly coupled to the fluid inlet hole and the second-pass outlet region. An outer diameter of the jet impingement nozzle is less than the diameter of the fluid outlet hole.

In yet another embodiment, a power electronics module includes a plurality of electrically and fluidly coupled power electronics card assemblies. Each power electronics card assembly includes a printed circuit board assembly and a power electronics device. The printed circuit board assembly includes a printed circuit board substrate, a power electronics device opening within the printed circuit board substrate, a fluid inlet channel extending within the printed circuit board substrate from a perimeter of the printed circuit board assembly to the power electronics device opening, a fluid outlet channel within the printed circuit board substrate extending from the perimeter of the printed circuit board assembly to the power electronics device opening, and electrically conductive power connections. The power electronics device is positioned within the power electronics device opening and includes a fluid inlet layer fluidly coupled to the fluid inlet channel, a fluid outlet layer fluidly coupled to the fluid outlet channel, a target heat transfer layer fluidly coupled to the fluid inlet layer, a second pass-heat transfer layer and a power device layer. The second-pass heat transfer layer is fluidly coupled to the target heat transfer layer and the fluid outlet layer such that coolant fluid flowing through the fluid inlet layer impinges the target heat transfer layer, flows into the second-pass heat transfer layer and out of the fluid outlet channel. The power device layer is coupled to the target heat transfer layer. The fluid inlet layer, the fluid outlet layer, the target heat transfer layer, the second-pass heat transfer layer, and the power device layer comprise a semiconductor material.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
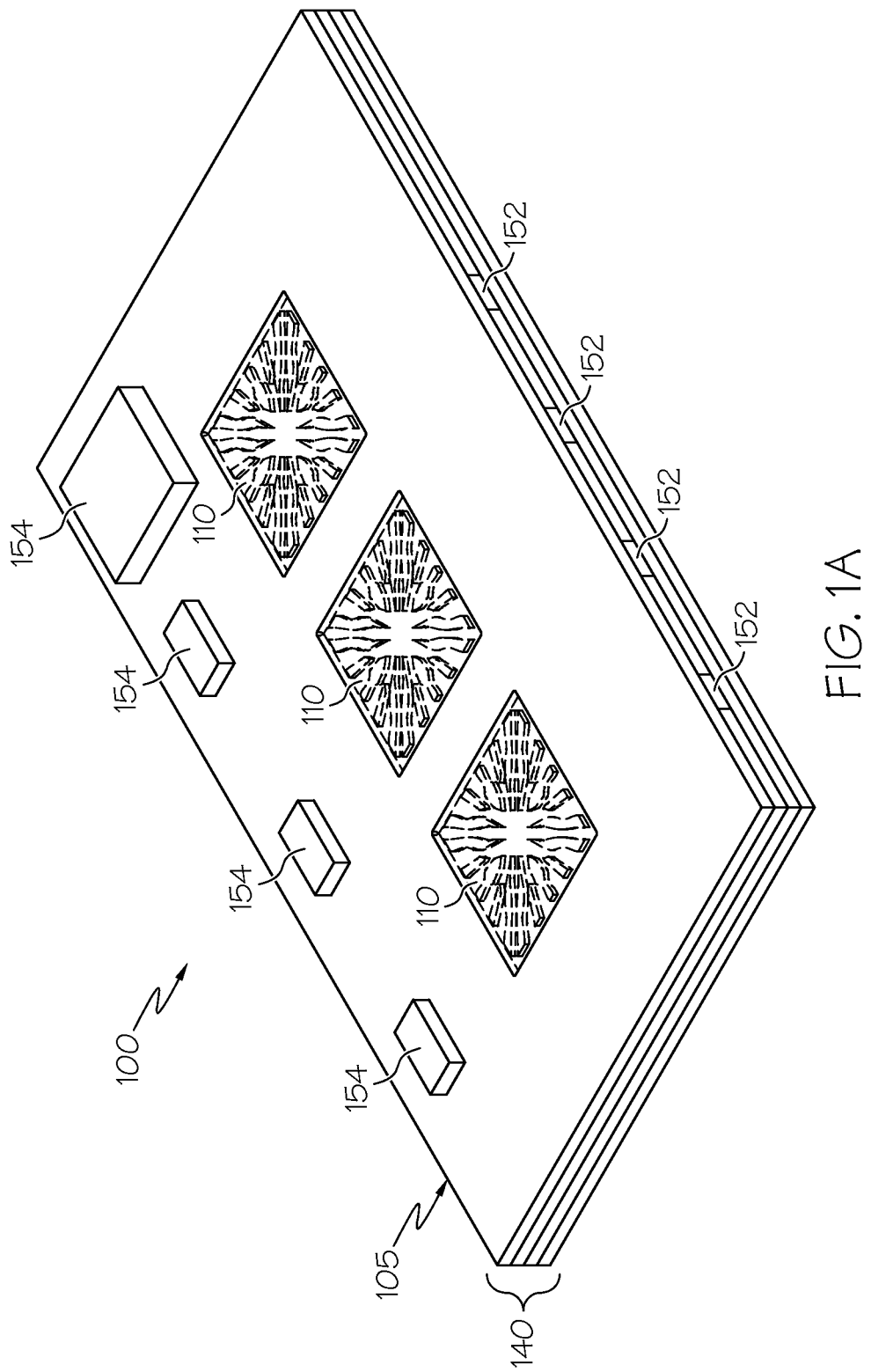
FIG. 1A depicts a top perspective view of a power electronics card assembly according to one or more embodiments shown and described herein.

FIG. 1A generally depicts one embodiment of a power electronics card assembly comprising a printed circuit board assembly having internal fluid channels and a plurality of power electronic device having an integral jet impinging cooling system. The power electronics card assembly provides for power electronics devices, cooling systems, and a control circuit all in one package. Internal printed circuit board fluid inlet channels and fluid outlet channels provide and remove coolant fluid to and from one or more power devices provided within the printed circuit board assembly. The power devices have integral, multi-pass heat transfer layers through which the coolant fluid circulates. The use of integral heat transfer layers and a positioning of the power electronics devices within the printed circuit board may eliminate the need for bonding layers and reduce overall thermal resistance. Various embodiments of power electronics devices, power electronics card assemblies, and power electronics modules are described in detail below.

Referring now to FIG. 1A, a top perspective and partially transparent view of exemplary power electronics card assembly 100 is schematically illustrated. The power electronics card assembly 100 generally comprises a printed circuit board assembly 105, three power electronics devices 110, power connection regions 152, and control circuit components 154. The power electronics devices 110, which are transparently illustrated to depict internal features, are positioned within a bulk of the printed circuit board assembly 105. It should be understood that more or fewer power electronics devices 110 may be included in the power electronics card assembly 100. As described in more detail below, the printed circuit board assembly 105 may comprise a printed circuit board substrate 140 having a plurality of layers. The printed circuit board substrate 140 has power electronics device openings defined therein to accept the power electronics devices 110. The printed circuit board assembly 105 may further include power connections 152 and control circuit components 154. The control circuit components 154, which may include active and/or passive components, may be included to drive or otherwise control the power electronics devices 110.

Figure 1B:
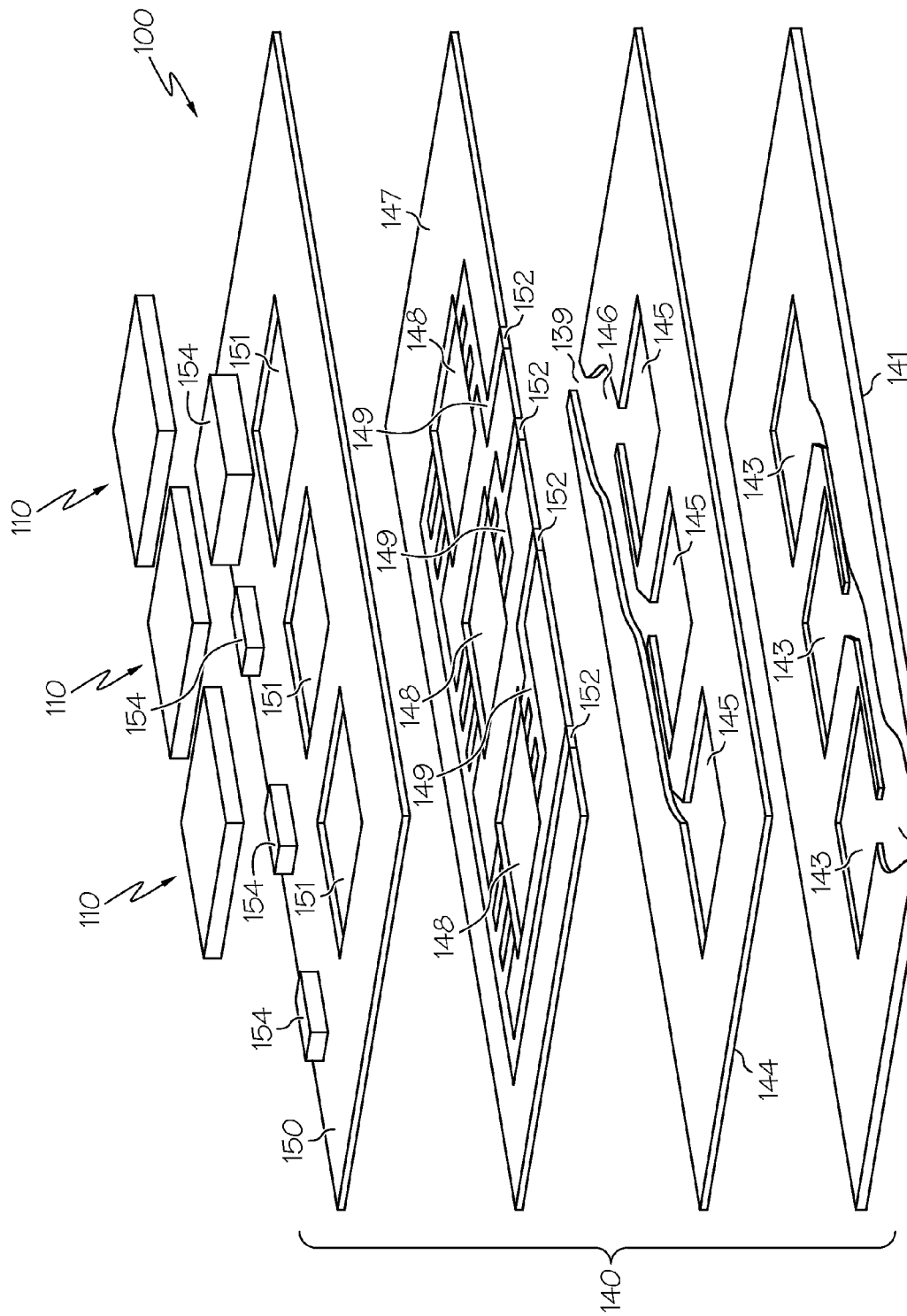
FIG. 1B depicts an exploded view of the power electronics card assembly depicted in FIG. 1A according to one or more embodiments shown and described herein.

Referring now to FIG. 1B, an exploded view of the various layers of the printed circuit board substrate 140 is illustrated. In one embodiment, the printed circuit board substrate 140 comprises a fluid inlet manifold layer 141, a fluid outlet manifold layer 144, a power circuit layer 147, and a control circuit layer 150. The layers of the printed circuit board substrate 140 may be made of any type of printed circuit board dielectric material including, but not limited to, FR-4, FR-1, CEM-1, CEM-3, or Teflon. Other known and unknown dielectric substrates may be used as the printed circuit board. The various layers of the printed circuit board substrate 140 may be coupled together by lamination, such as by epoxy resin. The dimensions of the various layers of the printed circuit board substrate 140 may depend on the particular application in which the power electronics card assembly 100 is implemented.

The fluid inlet manifold layer 141 comprises one or more power electronics device recesses 143 configured to accept the power electronics devices 110. The shape of the power electronics recesses 143 should correspond to the shape of the associated power electronics devices 110 such that the power electronics devices 110 are securely positioned within the power electronics device recesses 143. The power electronics device recesses 143 extend to a depth within the fluid inlet manifold layer 141. In one embodiment, the depth of the power electronics device recesses 143 is such that a top surface of the power electronics devices 110 is substantially flush with a top surface of the control circuit layer 150. In alternative embodiments, the top surface of the power electronics devices 110 may be positioned below or above the top surface of the control circuit layer 150.

The fluid inlet manifold layer 141 further comprises a fluid inlet channel 142 that extends from a fluid inlet opening 137 at a perimeter of the fluid inlet manifold layer 141 to each of the power electronics device recesses 143. The fluid inlet channel 142 fluidly couples the fluid inlet opening 137 to the power electronics device recesses 143 and the power electronics devices 110 disposed therein. The shape of the fluid inlet channel 142 may be optimized to provide for uniform coolant fluid flow to each of the power electronics device recesses 143. In the embodiment illustrated in FIG. 1B, the walls of the fluid inlet channel 142 are curved and the area of the fluid inlet channel 142 becomes smaller at power electronics device recesses 143 positioned distally from the fluid inlet opening 137.

The fluid inlet manifold layer 141 acts as a manifold that delivers coolant fluid to the power electronics card assembly 100. As described in more detail below, the fluid inlet opening 137 may be fluidly coupled to a coolant fluid reservoir that provides coolant fluid to the power electronics card assembly 100. The coolant fluid may enter the fluid inlet manifold layer 141 at the fluid inlet opening 137 and flow into each of the power electronics devices 110 maintained within the power electronics device recesses 143.

In one embodiment, the coolant fluid may be a dielectric coolant fluid, such as a coolant fluid utilized in direct-contact cooling devices, wherein the coolant fluid is in direct contact with electrically conductive components of the device to be cooled. In other embodiments in which the coolant fluid is not in direct contact with conductive and/or semi-conductive components, electrically conductive coolant fluid may be utilized.

The fluid outlet manifold layer 144 is coupled to the fluid inlet manifold layer 141. A bottom surface of the fluid outlet manifold layer 144 provides a top sealing layer of the fluid inlet channel 142, thereby maintaining the coolant fluid within the fluid inlet channel 142. The fluid outlet manifold layer 144 comprises one or more first power electronics device openings 145 and a fluid outlet channel opening 146. The first power electronics device openings 145 fully extend through a thickness of the fluid outlet manifold layer 144. The geometric configuration and placement of the first power electronics device openings 145 should be such that the first power electronics device openings 145 are substantially aligned with the power electronics device recesses 143 of the fluid inlet manifold layer 141. The first power electronics device openings 145, the power electronics device recesses 143, and the second and third power electronics device openings 148 and 151 (described below) define the power electronics device openings in which the power electronics devices 110 are positioned.

The fluid outlet channel opening 146 extends fully through the thickness of the fluid outlet manifold layer 144 and extends from the first power electronics device openings 145 to a fluid outlet opening 139 located at a perimeter of the fluid outlet manifold layer 144. A top surface of fluid inlet manifold layer 141 may act as a lower surface of a fluid outlet channel defined by the fluid outlet channel opening 146. The fluid outlet channel opening 146 fluidly couples the power electronics devices 110 disposed within the first power electronics device openings 145 to the fluid outlet opening 139. As described above with respect to the fluid inlet channel 142, the shape of the fluid outlet channel opening 146 may be optimized for uniform coolant fluid flow from each of the first power electronics device recesses 145.

The fluid outlet manifold layer 144 acts as a manifold that removes warmed coolant fluid from the power electronics card assembly 100. The fluid outlet opening 139 may be fluidly coupled to the coolant fluid reservoir for cooling.

The power circuit layer 147 is coupled to the fluid outlet manifold layer 144 such that a bottom surface of the power circuit layer 147 provides a top surface of the fluid outlet channel opening 146, thereby maintaining the coolant fluid within the fluid outlet channel defined by the fluid outlet channel opening 146, the top surface of the fluid inlet manifold layer 141 and the bottom surface of the power circuit layer 147.

The power circuit layer 147 comprises one or more second power electronics device openings 148 that fully extend through the thickness of the power circuit layer 147. The geometric configuration and placement of the second power electronics device openings 148 should be such that the second power electronics device openings 148 are substantially aligned with the first power electronics device openings 145 and the power electronics device recesses 143. The shape of the second power electronics device openings 148 should be such that the power electronics devices 110 may be disposed therein.

The power circuit layer 147 may further comprise one or more power connection features 149 that may electrically couple the power electronics devices 110 to the power connections or regions 152 and/or the control circuit components 154. The power circuit layer 147 may include electrical vias (not shown) to electrically couple the power connection features 149 to the power connections and/or the control circuit components 154. The power connection features 149 may be configured as conductive traces (e.g., copper traces) that provide an electrical path for electrical signals and power to and from the power electronics devices 110. In another embodiment, the power connection features 149 may be configured as electrically conductive wires positioned in recesses within the power circuit layer 147. In one embodiment, the power connection regions 152 may also be configured as conductive traces. In an alternative embodiment, the power connection regions 152 may be configured as an integrated connector that may be used to connect the power electronics card assembly 100 to an external circuit or electrical system.

The control circuit layer 150 is coupled to the power circuit layer 147 and comprises one or more third power electronics openings 151, the power connection regions 152, and the control circuit components 154. In an alternative embodiment, the control circuit layer does not include the control circuit components 154, but rather includes a control circuit connector (e.g., power connection regions 152 and a connector, not shown) that electrically couples the power electronics card assembly 100 to an external control circuit. The third power electronics device openings 151 may share the geometric configuration of, and be substantially aligned with, the first and second power electronics device openings 145, 148.

The power electronics devices 110 may be positioned within the power electronics openings defined by the power electronics recesses 143, the first power electronics device openings 145, the second power electronics device openings 148, and the third power electronics device openings 151. As described in more detail below, the various layers of the printed circuit board substrate 140 provide both fluid and electric coupling to the power electronics devices maintained therein.

Figure 1C:
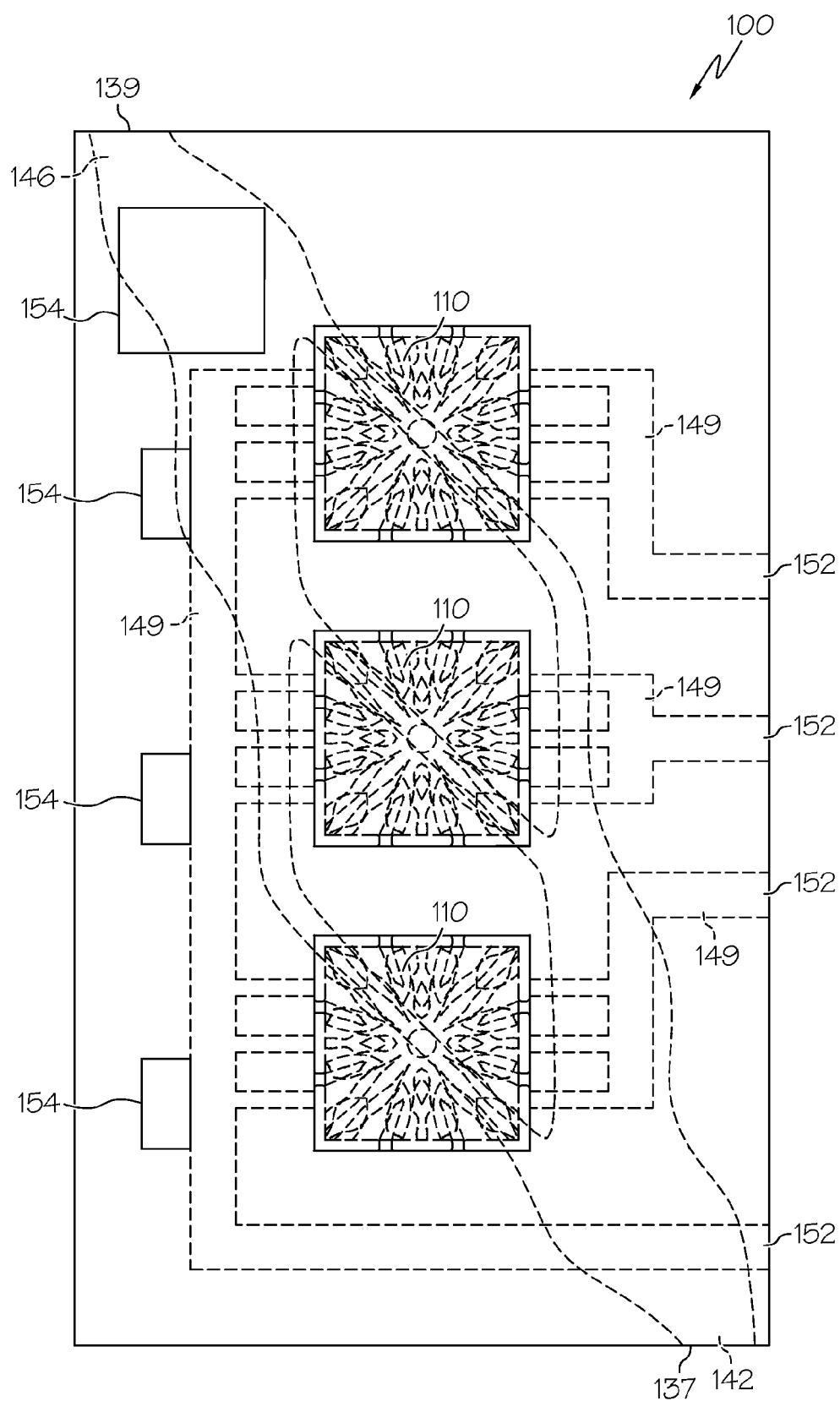
FIG. 1C depicts a top transparent view of the power electronics card assembly depicted in FIG. 1A according to one or more embodiments shown and described herein.

FIG. 1C is a top transparent view of the power electronics card assembly 100 illustrated in FIG. 1. The fluid inlet channel 142 fluidly couples the power electronics devices 110 to the fluid inlet opening 137, and the fluid outlet channel defined by the fluid outlet channel opening 146 fluidly couples the power electronics devices 110 to the fluid outlet opening 139.

Figure 2:
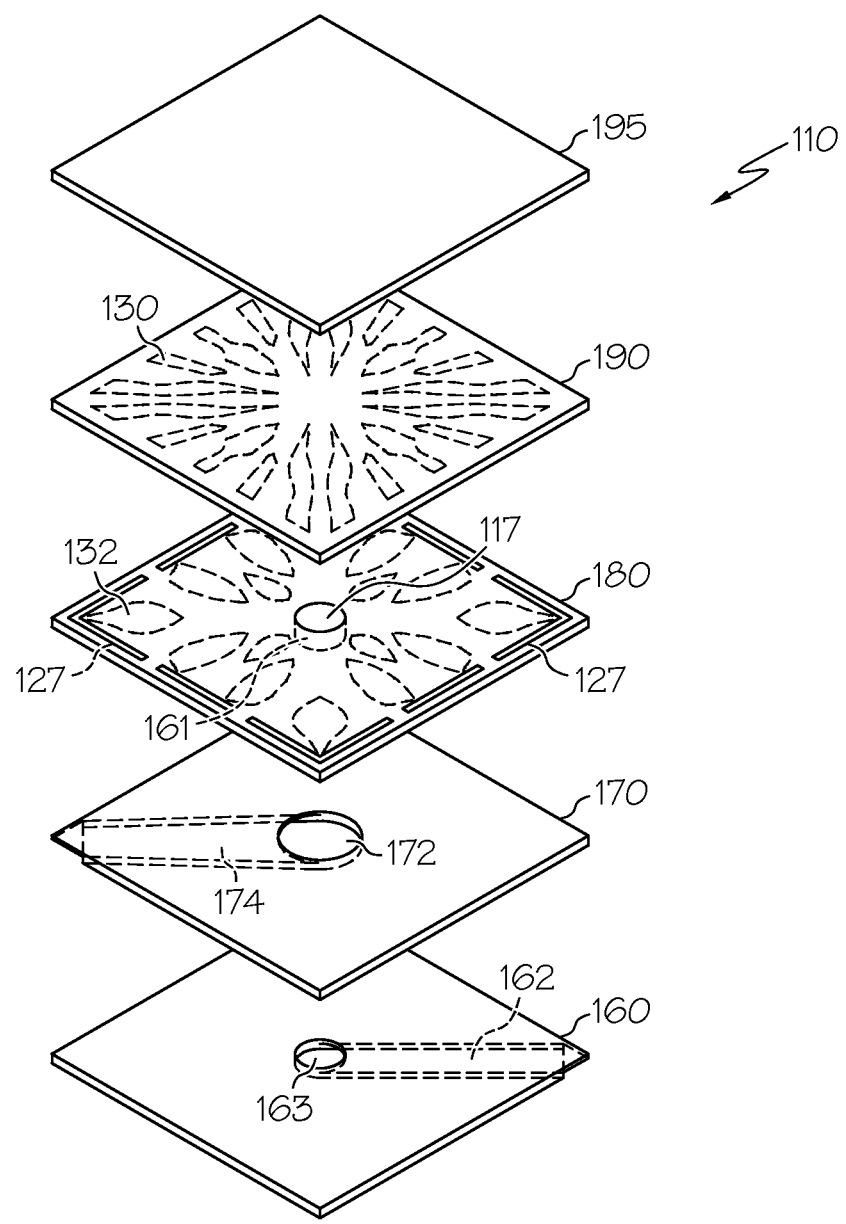
FIG. 2 depicts an exploded view of a power electronics device according to one or more embodiments shown and described herein.

Referring now to FIG. 2, a power electronics device 110 having integrated heat transfer layers is illustrated. The power electronics device 110 generally comprises a fluid inlet layer 160, a fluid outlet layer 170, a second-pass heat transfer layer 180, target heat transfer layer 190, and a power device layer 195. The various layers of the power electronics device 110 are integral, meaning that the various layers are all made of the same or similar semiconductor material and the cooling structure and semiconductor device are all included in a single power electronics device package. By integrating the cooling structure into the power electronics device itself using a semiconductor material, which is the same or similar semiconductor material as the semiconductor device of the power device layer 195, thermal resistance may be minimized and several layers of traditional power electronics packages may be eliminated (e.g., solder bond, substrate, and thermal interface material).

Figure 3:
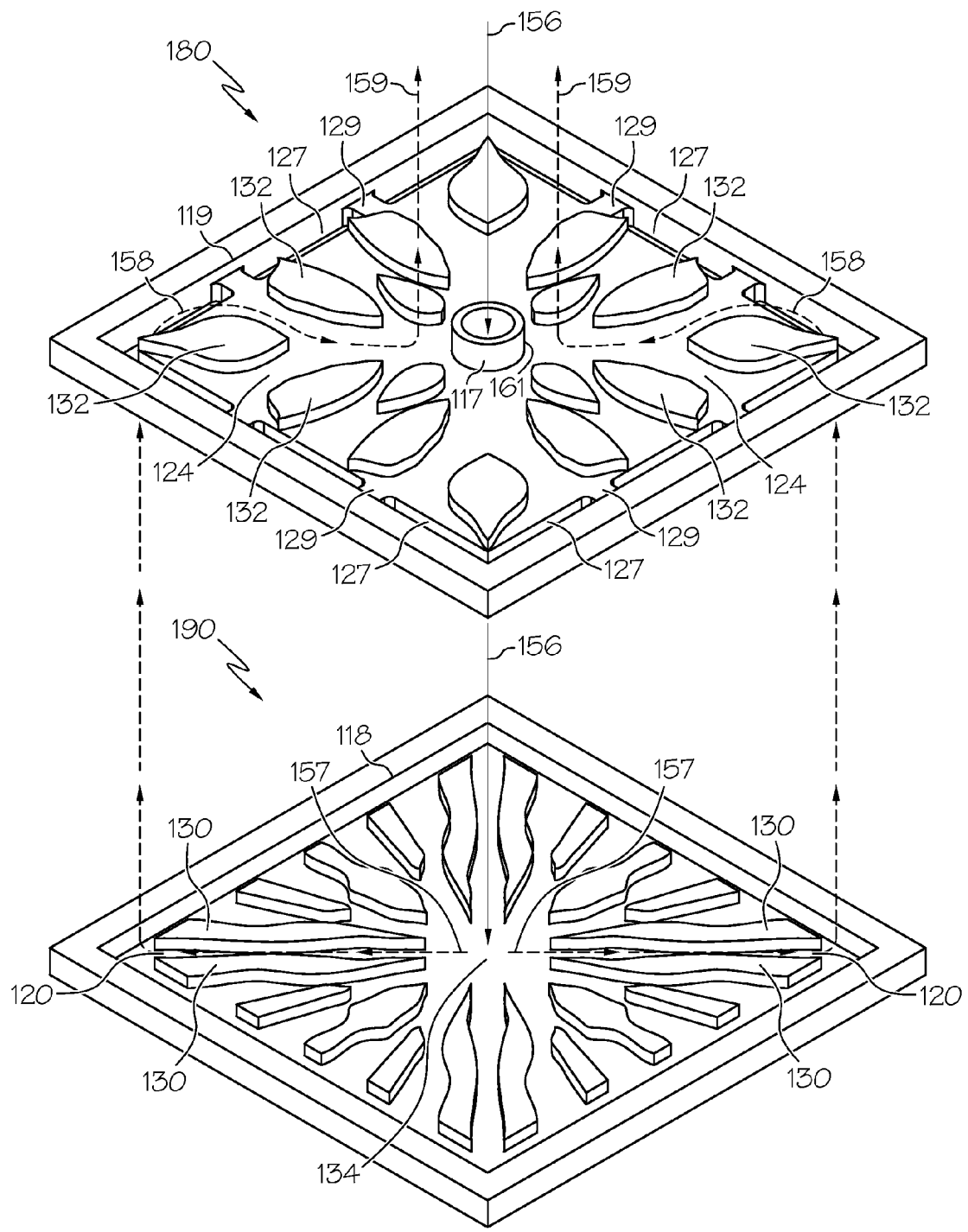
FIG. 3 depicts a top perspective view of a target heat transfer layer and a second-pass heat transfer layer of a power electronics device according to one or more embodiments shown and described herein.

It is noted that the power electronics device 110 illustrated in FIG. 2 is illustrated in an orientation as it would be inserted into the printed circuit board substrate 140 and the internal features of the various layers are illustrated as dashed lines because these features appear on an underside of the various layers. FIG. 3, described below, illustrates the features of the second-pass heat transfer layer 180 and the target heat transfer layer 190 in greater detail.

The various layers of the power electronics device 110 may be made from a semiconductor material, such as Si, SiN, GaN, SiC, and the like. The active regions of the semiconductor device (e.g., IGBT, RC-IGBT, MOSFET, power MOSFETs, diode, transistor, etc.) are provided in the power device layer 195. The semiconductor materials used to fabricate the semiconductor device may depend on the type of semiconductor device. In one embodiment, the semiconductor device is fabricated from doped Si. Generally, the remaining layers of the power electronics device 110 should be fabricated of the same semiconductor material used to fabricate the power device layer 195, or a semiconductor material that has similar thermal properties. The layers of the power electronics device 110 may be coupled together by known or unknown methods of coupled semiconductor layers. Additionally, the features of the various semiconductor layers may be created by any process used to fabricate semiconductor devices (e.g., deposition or etching).

The fluid inlet layer 160 comprises a device fluid inlet channel 162 extending from a perimeter of the fluid inlet layer 160 to a central fluid inlet hole 163. The device fluid inlet channel 162 may be configured as a recess within a thickness of the fluid inlet layer 160. When the power electronics device 110 is inserted into a power electronics device opening of the printed circuit board substrate 140, the device fluid inlet channel 162 is fluidly coupled to the fluid inlet channel 142 of the fluid inlet manifold layer 141. Accordingly, the device fluid inlet channel 162 should be substantially aligned with the fluid inlet channel 142 to provide for coolant fluid flow from the fluid inlet manifold layer 141 to the fluid inlet layer 160. The fluid inlet layer 160 is configured to receive the coolant fluid and distribute it to the other layers of the power electronics device 110.

The fluid outlet layer 170 is coupled to the fluid inlet layer 160. The fluid outlet layer 170 comprises a device fluid outlet channel 174 extending from a perimeter of the fluid outlet layer 170 to a fluid outlet hole 172. A diameter of the fluid outlet hole 172 may be larger than the diameter of the fluid inlet hole 163 such that the second-pass outlet region 117 (configured as a cylindrical jet impingement nozzle 161 in the illustrated embodiment) may be positioned therein.

The device fluid outlet channel 174 may be configured as a recess within a thickness of the fluid outlet layer 170. When the power electronics device 110 is inserted into a power electronics device opening of the printed circuit board substrate 140, the device fluid outlet channel 174 is fluidly coupled to the fluid outlet channel opening 146 of the fluid outlet manifold layer 144. Accordingly, the device fluid outlet channel 174 should be substantially aligned with the fluid outlet channel opening 146 to provide for coolant fluid flow from the fluid outlet layer 170 to the fluid outlet manifold layer 144.

The second-pass heat transfer layer 180 is coupled to the fluid outlet layer 170 and generally comprises one or more transition channels 127 and second-pass heat transfer layer fins 132 that direct coolant fluid flow. The transition channels 127 and the second-pass heat transfer layer fins 132 are described in more detail below with respect to FIG. 3. The second-pass heat transfer layer 180 further comprises an integral jet impingement nozzle 161 and a second-pass outlet region 117.

As described below, the jet impingement nozzle 161 and the second-pass outlet region 117 are operable to force a jet of coolant fluid onto the target heat transfer layer 190. An outside diameter of the jet impingement nozzle 161 is smaller than the fluid outlet hole 172 such that that jet impingement nozzle may fit through the fluid outlet hole 172 and be fluidly engaged with the fluid inlet hole 163 of the fluid inlet layer 160. Coolant fluid may flow from the fluid inlet hole 163 and into the jet impingement nozzle such that it by-passes the fluid outlet layer 170. In an alternative embodiment, the jet impingement nozzle is integral with the fluid inlet layer 160 rather than the second-pass heat transfer layer 180 such that the jet impingement nozzle is positioned through the fluid outlet hole and engages the second-pass heat transfer layer 180.

The target heat transfer layer 190 is coupled to the second-pass heat transfer layer 180. The target heat transfer layer 190 comprises a plurality of heat transfer layer fins 130 that route coolant fluid flow. As described in more detail below, the target heat transfer layer 190 is configured to receive an impingement jet of coolant fluid.

The power device layer 195, which contains the active portions of the semiconductor device, is coupled to the target heat transfer layer 190. In one embodiment, the power device layer 195 is not electrically isolated from the target heat transfer layer 190 and the coolant fluid comprises a dielectric fluid. In another embodiment, the power device layer 195 is electrically isolated from the target heat transfer layer 190 and the coolant fluid comprises a conductive coolant fluid.

Referring to FIGS. 2 and 3, features of the target heat transfer layer 190 and the second-pass heat transfer layer will be described in greater detail. The second-pass heat transfer layer 180 generally comprises transition channels 127 located around the second-pass heater transfer layer 180, a jet impingement nozzle 161, a second-pass outlet region 117, and a plurality of radially-extending second-pass heat transfer layer microchannels 124 that are defined by a plurality of second-pass heat transfer layer fins 132.

The radially-extending second-pass heat transfer layer microchannels 124 are defined by a plurality of second-pass heat transfer layer fins 132 of different shapes and sizes. The second-pass heat transfer layer fins 132 have curved walls and are geometrically optimized to reduce pressure drop, enhance heat transfer, and direct the coolant fluid toward the second-pass outlet region 117. By selecting the geometrical configuration of the second-pass heat transfer layer fins 132, the coolant fluid may more efficiently flow within the second-pass heat transfer layer microchannels 124. Curved walls also increase the surface area in which the coolant fluid is in contact within the second-pass heat transfer layer 180, thereby increasing thermal transfer from the second-pass heat transfer layer 180 to the coolant fluid. The geometric configuration of the second-pass heat transfer layer fins 132 and resulting second-pass heat transfer layer microchannels 124 positioned therebetween may be determined by computer simulation, for example. The geometric configuration utilized for the second-pass heat transfer layer microchannels 124 may depend on parameters such as flow resistance, the type of coolant fluid, and the desired maximum operating temperature of the power electronics device, for example.

The transition channels 127 fully extend through the second-pass heat transfer layer 180. In one embodiment, the central portion of the second-pass heat transfer layer 180 (i.e., second-pass heat transfer layer microchannels 124 and the second-pass heat transfer layer fins 132) are maintained by webbing features 129 that hold the central portion of the second-pass heat transfer layer to a perimeter of the second-pass heat transfer layer 180. The transition channels 127 may be configured as gaps between the webbing features 129. As described in more detail below, the transition channels 127 fluidly couple the second-pass heat transfer layer 180 to the target heat transfer layer 190.

Figure 4B:
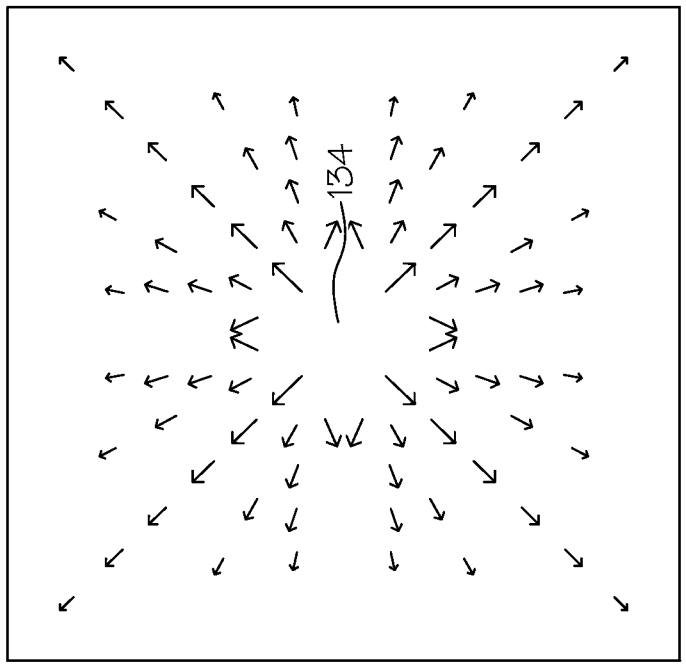
FIG. 4B depicts a coolant fluid flow pattern of a target heat transfer layer according to one or more embodiments shown and described herein.
Figure 4A:
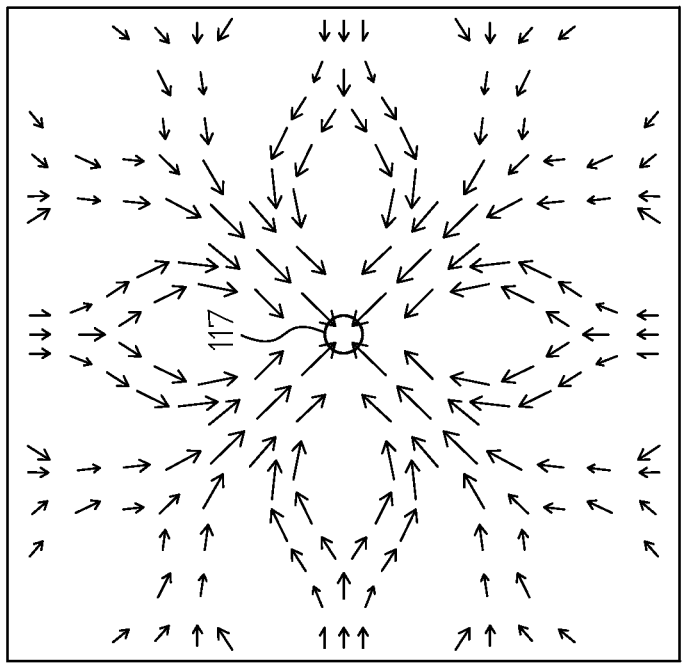
FIG. 4A depicts a coolant fluid flow pattern of a second-pass heat transfer layer according to one or more embodiments shown and described herein.

FIG. 4A illustrates a coolant fluid flow pattern within a second-pass heat transfer layer 180. The coolant fluid flows from the perimeter to the second-pass outlet region 117. Fluid flow within the second-pass heat transfer layer 180 will be described in more detail below.

Referring once again to FIGS. 2 and 3, the target heat transfer layer 190 generally comprises an impingement region 134, target heat transfer layer walls 118, and a plurality of radially-extending target heat transfer layer microchannels 120. The radially-extending target heat transfer layer microchannels 120 are defined by a plurality of target heat transfer layer fins 130 of various shapes and sizes. Like the second-pass heat transfer layer fins 132, the target heat transfer layer fins 130 have curved walls and are geometrically optimized to reduce pressure drop, enhance heat transfer, and direct the coolant fluid toward the perimeter of the target heat transfer layer 190. By selecting the geometrical configuration of the target heat transfer layer fins 130, the coolant fluid may more efficiently flow within the target heat transfer layer microchannels 120. Curved walls also increase the surface area in which the coolant fluid is in contact with the target heat transfer layer 190, thereby increasing thermal transfer from the target heat transfer layer 190 to the coolant fluid. The geometric configuration of the target heat transfer layer fins 130 and resulting target heat transfer layer microchannels 120 positioned therebetween may also be determined by computer simulation. The geometric configuration utilized for the target heat transfer layer microchannels 120 may depend on parameters such as flow resistance, the type of coolant fluid, and the desired maximum operating temperature of the power electronics device, for example.

The impingement region 134 is the central portion of the target heat transfer layer 190 that the jet of coolant fluid strikes. After striking the impingement region 134, the coolant fluid flows outwardly through the target heat transfer layer microchannels 120 toward the target heat transfer layer walls 118. A coolant fluid flow pattern of a target heat transfer layer 190 is illustrated in FIG. 4B. The coolant fluid flows from the impingement region 134 to the perimeter of the target heat transfer layer 190.

It is noted that the pattern defined by the target heat transfer layer microchannels 120 is different from the pattern defined by the second-pass heat transfer layer microchannels 124. The different patterns result from the difference in direction of fluid flow within the two layers. It is also noted that the second-pass heat transfer layer fins 132 differ in size and geometric configuration than those of the target heat transfer layer fins 130. It should be understood that target layer microchannel patterns and heat transfer layer microchannel patterns other than those illustrated may be utilized.

Operation of the power electronics card assembly 100 will now be described with general reference to FIGS. 1A-3. Heat flux generated by the power device layer 195 is transferred to the target heat transfer layer 190 and the remaining layers of the power electronics device 110. Coolant fluid may be introduced into the power electronics card assembly 100 through a coolant fluid line (not shown) and the fluid inlet opening 137. The coolant fluid then flows through the fluid inlet channel 142 and into each power electronics device 110 at the device fluid inlet channel 162. The coolant fluid flows toward the fluid inlet hole 163 of each power electronics device 110 and through the jet impingement nozzle 161, where it passes through the fluid outlet hole 172 of the fluid outlet layer 170 and the second-pass outlet region 117 of the second-pass heat transfer layer 180, and then impinges the impingement region 134 of the target heat transfer layer 190. The jet of coolant fluid (illustrated by arrow 156) impinges the target heat transfer layer 190 at impingement region 134. Heat flux is transferred to the coolant fluid at the impingement region 134.

The coolant fluid then changes direction to a flow direction that is normal to the jet of coolant fluid 156. The coolant fluid flows radially toward the perimeter of the target heat transfer layer 190 through the radially-extending target heat transfer layer microchannels 120, as indicated by arrows 157. Therefore, the coolant fluid flows over the surface of the target heat transfer layer 190 and is in contact with the various target heat transfer layer fins 130 to convectively and conductively transfer heat flux from the target heat transfer layer 190 to the coolant fluid. It should be understood that coolant fluid may flow through all of the target heat transfer layer microchannels 120 (and second-pass heat transfer layer microchannels 124) and that the arrows provided in FIG. 3 are for illustrative purposes only.

The coolant fluid then reaches the target heat transfer layer walls 118, where it is forced into the transition channels 127 of the second-pass heat transfer layer 180. The coolant fluid changes direction and flows within the transition channels 127 such that it travels in a direction that is normal to the direction of coolant flow within the target heat transfer layer 190. Enhanced thermal mixing occurs within the transition channel, which further increases heat transfer by convection.

After flowing into and out of the transition channels 127, the coolant fluid then is forced into the second-pass heat transfer layer 180 where it flows in a direction that is one hundred and eighty degrees from the flow direction in the target heat transfer layer 190. The coolant fluid flows from the perimeter toward the second-pass outlet region 117 as indicated by arrows 158. The coolant fluid therefore makes a second pass over the second-pass heat transfer layer 180, through the second-pass heat transfer layer microchannels 124, and continues to receive heat flux generated by the power device layer 195. After flowing through the second-pass heat transfer layer microchannels 124, the coolant fluid exits the second-pass heat transfer layer 180 as indicated by arrows 159. The coolant fluid concentrically flows through the fluid outlet hole 172 of the fluid outlet layer 170 with respect to the impingement jet nozzles 161 positioned within the fluid outlet hole 172. The coolant fluid then flows from the fluid outlet hole 172 into the device fluid outlet channel 174. The coolant fluid then flows into the fluid outlet channel opening 146 of the fluid outlet manifold layer 144, where it exits the power electronics card assembly 100 at the fluid outlet opening 139 and may be cooled in a secondary recirculation loop (not shown).

Figure 5:
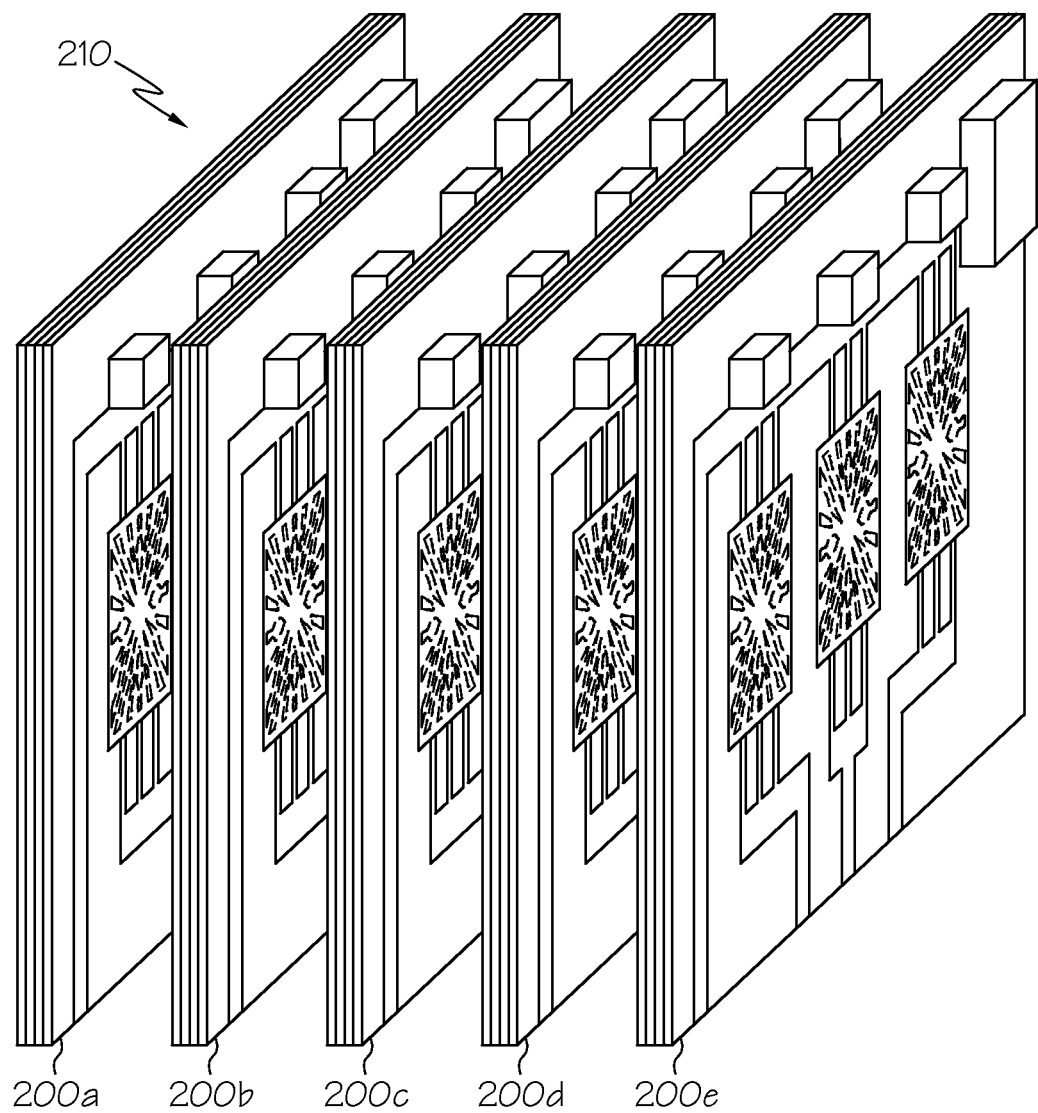
FIG. 5 depicts a power electronics module comprising a plurality of individual power electronics card assemblies according to one or more embodiments shown and described herein.

The power electronics card assembly 100 may be one component of a larger electrical system, such as a converter/inverter circuit of an electric or hybrid-electric vehicle, for example. Additionally, multiple power electronics card assemblies 100 may be coupled together to form the larger electrical system. FIG. 5 illustrates a power electronics module 210 that comprises five individual power electronics card assemblies 200a-200e. The power electronics card assemblies 200a-200e may be fluidly and electrically coupled together. In one embodiment, the power electronics card assemblies 200a-200e of the power electronics module 210 define a converter/inverter circuit of an electric or hybrid-electric vehicle. The power electronics module 210 may further comprise a frame (not shown) in which the individual power electronics card assemblies 200a-200e may be maintained. Individual power electronics card assemblies may be added or removed from the power electronic module 210 as needed to provide a flexible approach to building power circuits of varying designs.

It should now be understood that the embodiments described herein may be directed to power electronics devices and cooling systems that are integrated into a single assembly. In particular, power electronic devices may have integral multi-pass cooling systems and be positioned within a printed circuit board substrate having integral fluid channels. Embodiments reduce thermal resistance and eliminate extraneous layers (e.g., bond layers) by utilizing integral heat transfer layers and fluid inlet and outlet layers that are made of a semiconductor material. Coolant inlet and outlet manifold channels are built into the printed circuit board, thereby providing a fully integrated packaging solution.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics card assembly comprising:
    a printed circuit board assembly comprising:
        a printed circuit board substrate;
        a power electronics device opening within the printed circuit board substrate;
        a fluid inlet channel extending within the printed circuit board substrate from a perimeter of the printed circuit board assembly to the power electronics device opening;
        a fluid outlet channel within the printed circuit board substrate extending from the perimeter of the printed circuit board assembly to the power electronics device opening; and
        electrically conductive power connections; and
    a power electronics device positioned within the power electronics device opening, the power electronics device comprising:
        a fluid inlet layer fluidly coupled to the fluid inlet channel;
        a fluid outlet layer fluidly coupled to the fluid outlet channel;
        a target heat transfer layer fluidly coupled to the fluid inlet layer;
        a second-pass heat transfer layer fluidly coupled to the target heat transfer layer and the fluid outlet layer, wherein coolant fluid flowing through the fluid inlet layer impinges the target heat transfer layer, flows into the second-pass heat transfer layer, and out of the fluid outlet channel; and
        a power device layer coupled to the target heat transfer layer, wherein the fluid inlet layer, the fluid outlet layer, the target heat transfer layer, the second-pass heat transfer layer, and the power device layer comprise a semiconductor material.

2. The power electronics card assembly of claim 1, wherein:
    the printed circuit board substrate further comprises:
        a fluid inlet manifold layer comprising the fluid inlet channel and a power electronics device recess, wherein the fluid inlet channel is fluidly coupled to the power electronics device recess;
        a fluid outlet manifold layer comprising a fluid outlet channel opening defining the fluid outlet channel and a first power electronics device opening substantially aligned with the power electronics device recess, wherein the fluid outlet channel opening is fluidly coupled to the first power electronics device opening;
        a power circuit layer comprising a power connection feature, and a second power electronics device opening substantially aligned with the first power electronics device opening; and
        a control circuit layer comprising a third power electronics device opening substantially aligned with the second power electronics device opening; and
    the power electronics device opening is defined by the power electronics device recess, the first power electronics device opening, the second power electronics device opening, and the third power electronics device opening.

3. The power electronics card assembly of claim 2, wherein the fluid inlet manifold layer, the fluid outlet manifold layer, the power circuit layer, and the control circuit layer comprise a printed circuit board material and are bonded by an epoxy resin.

4. The power electronics card assembly of claim 1, wherein the fluid inlet channel and the fluid outlet channel comprise curved walls.

5. The power electronics card assembly of claim 1, wherein:
    the printed circuit board substrate comprises three power electronics device openings; and
    the power electronics card assembly comprises three power electronics devices positioned within the three power electronics device openings.

6. The power electronics card assembly of claim 5, wherein the fluid inlet channel and the fluid outlet channel are fluidly coupled to each of the three power electronics devices within each of the three power electronics device openings.

7. The power electronics card assembly of claim 1, wherein the printed circuit board assembly further comprises control circuit components coupled to a surface of the printed circuit board substrate.

8. The power electronics card assembly of claim 1, wherein the electrically conductive power connections are internal to the printed circuit board substrate, are electrically coupled to the power electronics device, and are exposed at the perimeter of the printed circuit board substrate.

9. The power electronics card assembly of claim 1, wherein:
the fluid inlet layer comprises a device fluid inlet channel and a fluid inlet hole, and the device fluid inlet channel is fluidly coupled to the fluid inlet hole and a perimeter of the fluid inlet layer;
the target heat transfer layer comprises a plurality of target heat transfer layer fins that define a plurality of target heat transfer layer microchannels extending in a radial direction from a central impingement region;
the second-pass heat transfer layer comprises a second-pass outlet region, a plurality of second-pass heat transfer layer fins that define a plurality of second-pass heat transfer layer microchannels extending in a radial direction toward the second-pass outlet region, and one or more transition channels positioned at a perimeter of the second-pass heat transfer layer, the one or more transition channels fluidly coupling the target heat transfer layer to the second-pass heat transfer layer;
the fluid outlet layer comprises a device fluid outlet channel and a fluid outlet hole, the device fluid outlet channel is fluidly coupled to the fluid outlet hole and a perimeter of the fluid outlet layer, and the fluid outlet hole is fluidly coupled to the second-pass outlet region;
a diameter of the fluid outlet hole is greater than a diameter of the fluid inlet hole;
the power electronics device further comprises a jet impingement nozzle comprising a semiconductor material, positioned through the fluid outlet hole, and fluidly coupled to the fluid inlet hole and the second-pass outlet region; and
an outer diameter of the jet impingement nozzle is less than the diameter of the fluid outlet hole.

10. A power electronics device comprising:
a fluid inlet layer comprising a device fluid inlet channel and a fluid inlet hole, wherein the device fluid inlet channel is fluidly coupled to the fluid inlet hole and a perimeter of the fluid inlet layer, and the fluid inlet layer comprises a semiconductor material;
a target heat transfer layer comprising a plurality of target heat transfer layer fins that define a plurality of target heat transfer layer microchannels extending in a radial direction from a central impingement region, wherein the target heat transfer layer comprises a semiconductor material;
a power device layer coupled to the target heat transfer layer, wherein the power device layer comprises a semiconductor device;
a second-pass heat transfer layer coupled to the target heat transfer layer, the second-pass heat transfer layer comprising a second-pass outlet region, a plurality of second-pass heat transfer layer fins that define a plurality of second-pass heat transfer layer microchannels extending in a radial direction toward the second-pass outlet region, and one or more transition channels positioned at a perimeter of the second-pass heat transfer layer, wherein the one or more transition channels fluidly couple the target heat transfer layer to the second-pass heat transfer layer, and the second-pass heat transfer layer comprises a semiconductor material;
a fluid outlet layer coupled to the fluid inlet layer and the second-pass heat transfer layer, the fluid outlet layer comprising a device fluid outlet channel and a fluid outlet hole, wherein:
the device fluid outlet channel is fluidly coupled to the fluid outlet hole and a perimeter of the fluid outlet layer, and the fluid outlet hole is fluidly coupled to the second-pass outlet region;
a diameter of the fluid outlet hole is greater than a diameter of the fluid inlet hole; and
the fluid outlet layer comprises a semiconductor material; and
a jet impingement nozzle positioned through the fluid outlet hole and fluidly coupled to the fluid inlet hole and the second-pass outlet region, wherein an outer diameter of the jet impingement nozzle is less than the diameter of the fluid outlet hole, and the jet impingement nozzle comprises a semiconductor material.

11. The power electronics device of claim 10, wherein the target heat transfer layer fins and the second-pass heat transfer layer fins comprise curved walls.

12. The power electronics device of claim 10, wherein a target heat transfer layer microchannel pattern that is defined by the plurality of target heat transfer layer microchannels is different from a second-pass heat transfer layer micro channel pattern that is defined by the plurality of second-pass heat transfer layer microchannels.

13. The power electronics device of claim 10, wherein the jet impingement nozzle is integral with the second-pass heat transfer layer at the second-pass outlet region.

14. The power electronics device of claim 10, wherein the one or more transition channels are normal to the plurality of target heat transfer layer microchannels and the plurality of second-pass heat transfer layer microchannels.

15. The power electronics device of claim 10, wherein the fluid outlet hole is concentric with respect to the jet impingement nozzle.

16. A power electronics module comprising:
a plurality of electrically and fluidly coupled power electronics card assemblies, each power electronics card assembly comprising:
a printed circuit board assembly comprising:
a printed circuit board substrate;
a plurality of power electronics device openings within the printed circuit board substrate;
a fluid inlet channel extending within the printed circuit board substrate from a perimeter of the printed circuit board assembly to the plurality of power electronics device openings;
a fluid outlet channel within the printed circuit board substrate extending from the perimeter of the printed circuit board assembly to the plurality of power electronics device openings; and
electrically conductive power connections; and
a plurality of power electronics devices positioned within the plurality of power electronics device openings, each power electronics device comprising:
a fluid inlet layer fluidly coupled to the fluid inlet channel;
a fluid outlet layer fluidly coupled to the fluid outlet channel;
a target heat transfer layer fluidly coupled to the fluid inlet layer;

a second-pass heat transfer layer fluidly coupled to the target heat transfer layer and the fluid outlet layer, wherein coolant fluid flowing through the fluid inlet layer impinges the target heat transfer layer, flows into the second-pass heat transfer layer and out of the fluid outlet channel; and a power device layer coupled to the target heat transfer layer, wherein the fluid inlet layer, the fluid outlet layer, the target heat transfer layer, the second-pass heat transfer layer, and the power device layer comprise a semiconductor material.

17. The power electronics module of claim 16, wherein:

the printed circuit board substrate further comprises:

- a fluid inlet manifold layer comprising the fluid inlet channel and a plurality of power electronics device recesses, wherein the fluid inlet channel is fluidly coupled to the plurality of power electronics device recesses;
- a fluid outlet manifold layer comprising a fluid outlet channel opening defining the fluid outlet channel and a plurality of first power electronics device openings substantially aligned with the plurality of power electronics device recesses, wherein the fluid outlet channel opening is fluidly coupled to the plurality of first power electronics device openings;
- a power circuit layer comprising a plurality of power connection features, and a plurality of second power electronics device openings substantially aligned with the plurality of first power electronics device openings; and
- a control circuit layer comprising a plurality of third power electronics device openings substantially aligned with the plurality of second power electronics device openings; and the plurality of power electronics device openings is defined by the plurality of power electronics device recesses, the plurality of first power electronics device openings, the plurality of second power electronics device openings, and the plurality of third power electronics device openings.

18. The power electronics module of claim 16, further comprising a frame, wherein the plurality of electrically and fluidly coupled power electronics card assemblies is positioned within the frame.

19. The power electronics module of claim 16, wherein the printed circuit board assembly further comprises control circuit components coupled to a surface of the printed circuit board substrate.

20. The power electronics module of claim 16, wherein:

the fluid inlet layer comprises a device fluid inlet channel and a fluid inlet hole, and the device fluid inlet channel is fluidly coupled to the fluid inlet hole and a perimeter of the fluid inlet layer, and the fluid inlet layer comprises a semiconductor material;

the target heat transfer layer comprises a plurality of target heat transfer layer fins that define a plurality of target heat transfer layer microchannels extending in a radial direction from a central impingement region;

the second-pass heat transfer layer comprises a second-pass outlet region, a plurality of second-pass heat transfer layer fins that define a plurality of second-pass heat transfer layer microchannels extending in a radial direction toward the second-pass outlet region, and one or more transition channels positioned at a perimeter of the second-pass heat transfer layer, the one or more transition channels fluidly coupling the target heat transfer layer to the second-pass heat transfer layer;

the fluid outlet layer comprises a device fluid outlet channel and a fluid outlet hole, the device fluid outlet channel is fluidly coupled to the fluid outlet hole and a perimeter of the fluid outlet layer, and the fluid outlet hole is fluidly coupled to the second-pass outlet region;

a diameter of the fluid outlet hole is greater than a diameter of the fluid inlet hole;

the power electronics device further comprises a jet impingement nozzle comprising a semiconductor material, positioned through the fluid outlet hole, and fluidly coupled to the fluid inlet hole and the second-pass outlet region; and an outer diameter of the jet impingement nozzle is less than the diameter of the fluid outlet hole.

* * * * *